United States Patent
Nebel

(10) Patent No.: US 6,392,440 B2
(45) Date of Patent: May 21, 2002

(54) 5V COMPLIANT TRANSMISSION GATE AND THE DRIVE LOGIC USING 3.3V TECHNOLOGY

(75) Inventor: Gerhard Nebel, Immenstadt (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/729,061

(22) Filed: Dec. 4, 2000

Related U.S. Application Data

(63) Continuation of application No. PCT/DE99/01618, filed on Jun. 1, 1999.

(30) Foreign Application Priority Data

Jun. 4, 1998 (DE) .......................................... 198 25 061

(51) Int. Cl.[7] .......................................... H03K 19/0175
(52) U.S. Cl. .............................. 326/81; 326/83; 326/34
(58) Field of Search .............................. 326/80, 81, 83, 326/34, 121, 113

(56) References Cited

U.S. PATENT DOCUMENTS

| | | | | |
|---|---|---|---|---|
| 5,465,054 A | * | 11/1995 | Erhart | 326/34 |
| 5,939,932 A | * | 8/1999 | Lee | 327/436 |
| 6,031,395 A | * | 2/2000 | Choi et al. | 326/83 |

* cited by examiner

*Primary Examiner*—Michael Tokar
*Assistant Examiner*—Daniel D. Chang
(74) *Attorney, Agent, or Firm*—Herbert L. Lerner; Laurence A. Greenberg; Werner H. Stemer

(57) ABSTRACT

The logic gate has at least one input terminal in which a digital input signal is applied having two possible logical signal values and at least one output terminal to output an output signal having a logical signal values. Two different logical voltage levels are allocated to both possible logical signal values of the output signal and a logic circuit is provided between the input and the output terminals. The logic circuit has several switching elements, especially switching transistors, working or produced according to the logical voltage level. The logic circuit is supplied with a supply potential that exceeds the logic voltage level. The logic circuit has at least two switching elements, especially switching transistors, in the output path allocated to the output terminal.

8 Claims, 4 Drawing Sheets

5V COMPLIANT TRANSMISSION GATE AND THE DRIVE LOGIC USING 3.3V TECHNOLOGY

CROSS-REFERENCE TO RELATED APPLICATION

This is a continuation of copending International Application PCT/DE99/01618, filed Jun. 1, 1999, which designated the United States.

BACKGROUND OF THE INVENTION

Field of the Invention

The invention relates to a logic gate with at least one input terminal, at which an input signal is present in two possible logic signal values, and with at least one output terminal for outputting an output signal with a logic signal value. The two possible logic signal values of the output signal are assigned two different logic voltage levels (HIGH, LOW). The configuration further has a logic circuit, which is provided between the input and output terminals and a plurality of switching elements, in particular switching transistors, which are produced or operate according to the logic voltage levels. The logic circuit is supplied by a supply potential that exceeds the logic voltage levels.

Logic gates are the elementary basic building blocks of digital circuits and systems. They control the signal flow through the entire system. The designation gate indicates that they can be opened and closed by the signals present at the input and, in this way, either pass the information on or prevent it from being passed on. Elements appertaining to two-value (binary) logic are considered below, the two logic signal values 0 and 1 being differentiated by the two different voltage levels H or HIGH (typically 3.3 V or 5 V) and L or LOW (typically 0.2 V up to about 1.4 V).

In digital CMOS circuitry, so-called transmission gates (T-gates for short) are widespread in addition to the usual basic gates such as inverters, NAND, NOR and complex gates. The term pass transistor logic also crops up occasionally in this context. This involves a transistor pair consisting of an N-MOS and a P-MOS transistor which are connected in parallel and driven inversely at their gates. As a rule, a T-gate thus comprises two paths, an N-channel transistor path, which can switch through low to medium potentials, and a P-channel transistor path, which can switch through medium to high potentials. In the case of the T-gates known heretofore, each of these paths consists of just one transistor. In one case, both transistors are turned off and constitute an extremely high resistance between their two terminals. In the other case, a conductive connection with a finite resistance is produced between the terminals. A T-gate thus operates like a switch but with the limitation that only voltage potentials lying within the operating voltage of the T-gate can be switched.

The customary operating voltage for the HIGH level has been 5 V for many years. That operating voltage can no longer be adhered to in modern CMOS processes since the transistors have become so small that the physical limit of the maximum field strength is exceeded at 5 V. This is the reason why nowadays there are already many integrated circuits which operate internally with an operating voltage for the HIGH level that has been reduced to 3.3 V. For reasons of compatibility, however, externally the circuits still operate predominantly with 5 V signals. Therefore, level converters are necessary at the interface between the digital circuit and the outside world (that is generally the pad driver circuit). In the case of analog circuits, that means that T-gates have to establish the connection to the outside world. To ensure that the full swing of the analog signals of 5 V can be utilized, circuitry measures must be implemented to construct a T-gate in such a way that no voltages of 5 V occur at the 3.3 V switching transistors of the digital circuit which are to be driven. Otherwise, the service life of the transistors produced using 3.3 V processes would be considerably reduced.

Up to now there have been known only implementations in purely digital circuits which operate with 3.3 V internally and with 5 V externally. Chandrakasan, Burstein, and Brodersen, in "A Low-Power Chipset for a Portable Multimedia I/O Terminal", IEEE J. of Solid-State Circuits, Vol. 29, No. 12, pp. 1415–28, December 1994, describe a circuit which amplifies 1.1 V signals to the external 5 V swing. The technology thereby used is 5 V compliant.

Pelgrom and Dijkmans, in "A 3/5 volt compatible I/O buffer", Proc. ESSCIRC, p. 140–43, Ulm 1994, describe a bi-directional circuit using 3.3 V technology which operates with 3.3 V internally and permits external signals of up to 5 V.

Both the aforementioned cases involve level converters which establish the connection between two circuit environments with different operating voltages. A 5 V compliant T-gate and the drive logic required therefor using 3.3 V technology have not been disclosed heretofore.

SUMMARY OF THE INVENTION

The object of the invention is to provide a logic gate circuit which overcomes the above-noted deficiencies and disadvantages of the prior art devices and methods of this kind, and which can perform the function of a T-gate and is constructed in such a way that 5 V signals can be switched without a transistor being operated with impermissibly high voltages.

With the above and other objects in view there is provided, in accordance with the invention, a logic gate, comprising:

an input terminal for receiving an input signal with two possible logic signal values;

an output terminal for outputting an output signal with two possible logic signal values assigned two different logic voltage levels;

a logic circuit connected between the input terminal and the output terminal and supplied by a supply potential exceeding the logic voltage levels;

the logic circuit having a plurality of switching elements, such as switching transistors, configured to operate according to the logic voltage levels, the logic circuit having an output path connected to the output terminal, the output path having at least two switching elements configured to operate according to the logic voltage levels, connected in series, and acting as a voltage divider.

In other words, the invention provides a logic gate circuit having at least one input terminal, at which an input signal is present in two possible logic signal values, and having at least one output terminal for outputting an output signal with a logic signal value, the two possible logic signal values of the output signal being assigned two different logic voltage levels and having a logic circuit, which is provided between the input and output terminals and has a plurality of switching elements, in particular switching transistors, which are produced or operate according to the logic voltage levels, which logic circuit is supplied by a supply potential exceeding the logic voltage levels, in which case the logic circuit has, in its output path assigned to the output terminal, at least two switching elements, in particular switching transistors, which are connected in series and act as a voltage divider.

In accordance with an added feature of the invention, the logic circuit has output path has two reciprocally operating output paths (pull-up path and pull-down path) with switching elements constructed and operating complementarily with respect to one another.

The two output paths may expediently be constructed symmetrically with respect to one another with the output terminal as the point of symmetry.

An essential advantage of the arrangement according to the invention is that a T-gate constructed in such a way can switch higher voltages than a conventional T-gate with the same dielectric strength of the individual transistors. The invention makes it possible to use 3.3 V manufacturing technology to construct 5 V CMOS logic which is suitable for driving T-gates according to the invention which are able to switch (analog) signals with a voltage swing of 5 V.

In accordance with a preferred embodiment of the invention, a CMOS inverter may be provided for driving the T-gate, which inverter can process 5 V signals at the input and once again supplies the full 5 V swing at the output. This circuit is also designed in such a way that the voltage across the transistors always remains distinctly below 5 V. By means of suitable extension, a NAND or a NOR gate and the like may be constructed from the inverter. The combination of the these two extensions can, finally, lead to a complex gate. The invention thus encompasses a complete CMOS logic including T-gates which operates with 5 V signals and can be realized using a modern 3.3 V process.

In accordance with a further preferred embodiment of the invention, the logic circuit has, in each output path, a further, third switching element connected in series with the two first and second switching elements.

In accordance with an additional feature of the invention, the logic circuit has, in each output path, a protective diode device for discharging leakage currents from the switching elements. By way of example, two transistors connected as diodes can dissipate the leakage currents of the limiting transistors and prevent an impermissible voltage rise across the turned-off switching transistors when the T-gate is switched off. The use of such diodes makes it possible to ensure that no impermissible gate voltages occur at the switching transistors due to leakage currents.

Other features which are considered as characteristic for the invention are set forth in the appended claims.

Although the invention is illustrated and described herein as embodied in a logic gate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
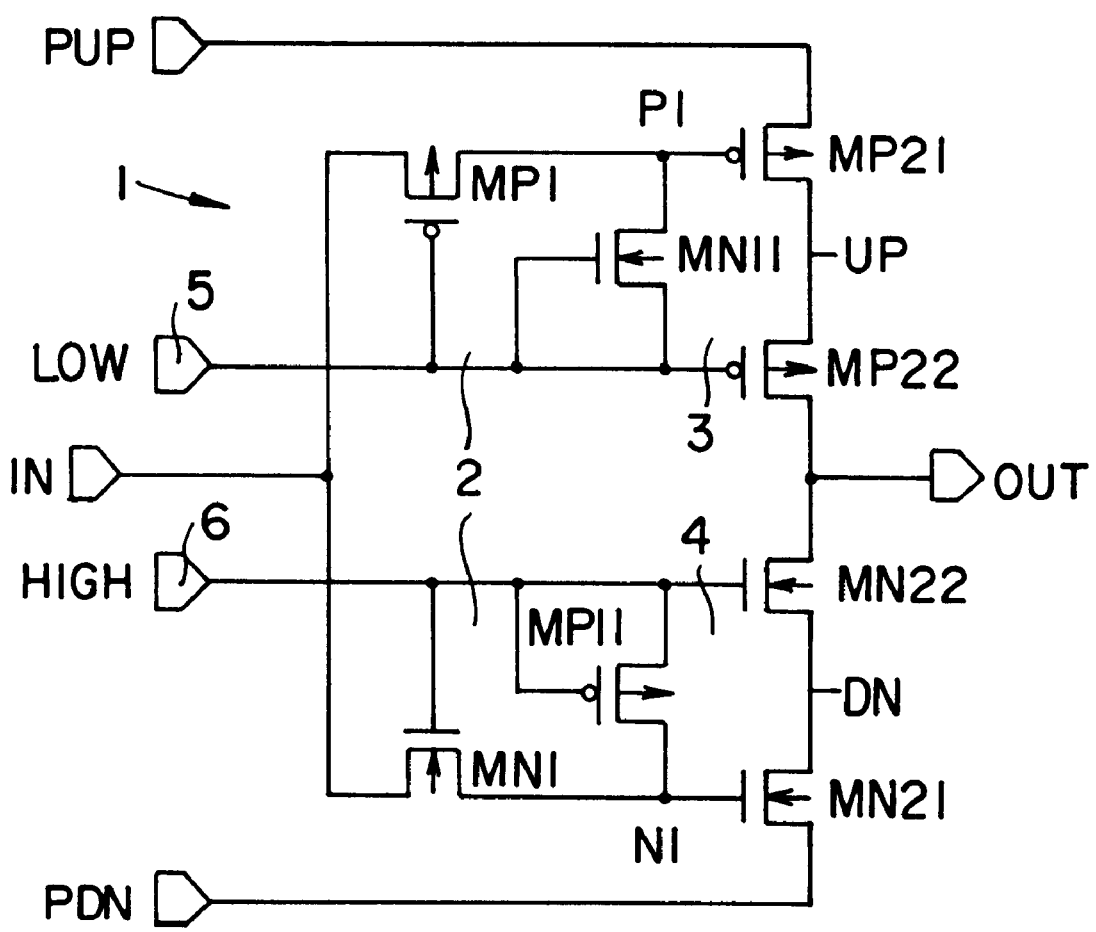
FIG. 1 is a circuit diagram of a logic gate formed as an inverter according to a first exemplary embodiment.

Referring now to the figures of the drawing in detail and first, particularly, to FIG. 1 thereof, there is seen a logic gate 1 that is configured as an inverter (NOT gate), which operates with 5 V signals and can be manufactured using 3.3 V technology. The logic gate 1 has an input terminal IN, at which an input signal is present in two possible logic signal values HIGH=5 V and LOW=0 V, and an output terminal OUT for outputting an output signal with a signal value, LOW or HIGH, which is the inverse of that of the input signal, and a logic circuit 2, which is provided between the input and output terminals and comprises two alternatingly operating output paths 3 and 4, the pull-up and pull-down paths. The two paths 3 and 4 have switching elements which are constructed and operate complementarily with respect to one another. The logic circuit 2 is supplied by a supply potential PUP exceeding the logic voltage levels HIGH and LOW. Each output path 3 and 4 of the logic circuit 2 has two P-channel MOS switching transistors MP21 and MP22 and N-channel MOS switching transistors MN21 and MN22, respectively, which are connected in series and are connected as voltage dividers. The operating voltage is fed to the terminals PUP and PDN. As a rule, PDN is at 0 V, the reference-ground potential, and PUP is at 5 V, the maximum operating voltage. Signals smaller than 5 V are required for driving the T-gate which is explained below. That is achieved by connecting PUP or PDN to an auxiliary voltage. The auxiliary voltages are fed to the terminals 5 (LOW) and 6 (HIGH). They have values of 1.4 V for LOW and 3.6 V for HIGH relative to the reference-ground potential. The realization is based on an N-well process, the wells (not illustrated) being put at 5 V and the substrate (not illustrated) being put at 0 V. The pull-up path 3 and the pull-down path 4 are symmetrical with respect to one another, respective P-channel transistors corresponding to the N-channel transistors, and vice versa.

In order to explain the method of operation of the circuit according to FIG. 1, it suffices, for symmetry reasons, to consider just the pull-down path 4.

If the inverter input IN is at 5 V, the transistor MN1 pulls the node N1 high to 3.6 V (HIGH). Above this voltage value, the transistor MN1 is pinched off (UGS=0) and prevents a further voltage rise at the node N1. This ensures that the gate-source voltage at the switching transistor MN21 does not exceed 3.6 V. The transistor MN21 holds the node DN down, as a result of which the transistor MN22 also starts to conduct and pulls the inverter output OUT to 0 V. Without the transistor MP11, leakage currents in the steady-state case would charge the gate of the transistor MN21 further, since the gate of a MOS transistor provides better insulation than a switched-off transistor. The diode MP11 starts to conduct when the potential at the node N1 exceeds the potential value HIGH (3.6 V), and thus prevents a further potential rise at the node N1.

If the inverter input IN is at 0 V, the transistor MN1 conducts and discharges the node N1. As a result, the switching transistor MN21 is turned off. The pull-up path 3 now operates in an analogous manner to that described above. The node P1 goes from 5 V down to 1.4 V (LOW) and drives the switching transistor MP21. The inverter output OUT is subsequently pulled high to a full 5 V via the transistor MP22. However, the node DN follows only up to 3.6 V, because the transistor MN22 is pinched off above this value. Therefore, this transistor limits the voltage rise at the node DN in the same way as the transistor MN1 limits the voltage rise at the node N1. Any leakage currents present are unproblematic here since they do not act on an insulated gate but on a turned-off transistor MN21, which is likewise affected by leakage current. Should the node DN rise to higher voltage values than HIGH, the gate-source voltage of the transistor MN22 becomes negative, so that this transistor conducts even less than the transistor MN21, whose gate-source voltage is 0 V. A further voltage rise at the node DN is thus precluded.

The method of operation of the inverter circuit according to FIG. 1 can be summarized as follows. The transistors MN21 and MP21 form the switching transistors for the pull-down path 4 and pull-up path 3, respectively, and are connected by their source terminals to the operating voltages PUP and PDN, respectively. The PDN and PUP transistors MN1 and MP1 limit the gate voltage, and the transistors MN22 and MP22 limit the drain voltage of the switching transistors. The diodes MN11 and MP11 discharge the leakage currents from the transistors MN1 and MP2, respectively. As a result of the series circuit of three N-channel transistors MN1, MN21, MN22 in one path and three P-channel transistors MP1, MP21, MP22 in the other path, the effect achieved according to the embodiment as shown in FIG. 1 is that the high supply voltage of 5 V, for example, is split between the individual transistors. The four outer transistors MN1, MN22; MP1, MP22 limit the voltage across the inner switching transistors MN21 and MP21, respectively. Such a circuit makes it possible to switch 5 V signals even though the individual transistors MN1, MN21, MN22, MP1, MP21, MP22 are designed only for 3.3 V.

Figure 2:
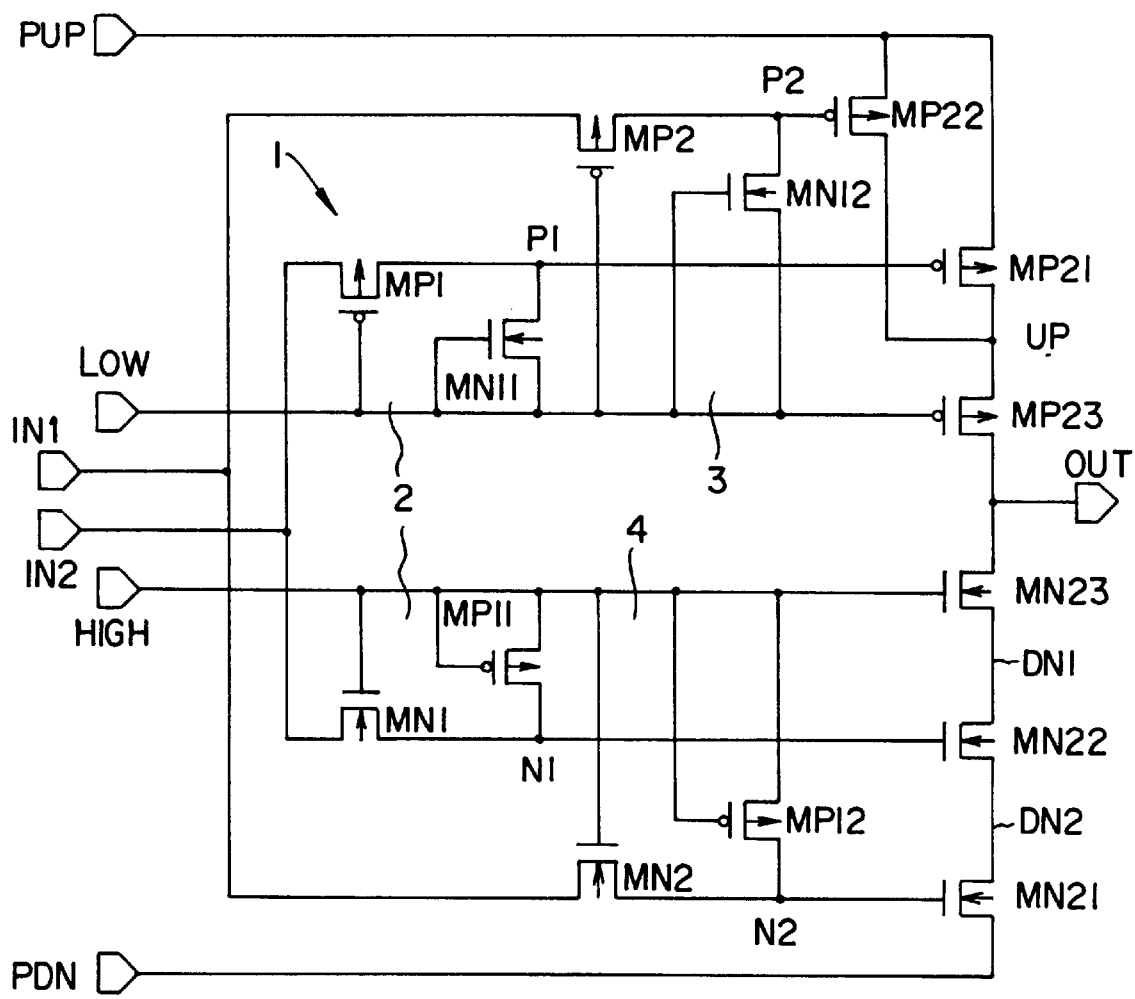
FIG. 2 is a circuit diagram of a logic gate formed as a NAND gate according to a secondary exemplary embodiment.

By means of corresponding extension, a NAND gate according to FIG. 2 is produced from the inverter according to FIG. 1 by two N-channel pull-down transistors being connected in series and two P-channel pull-up transistors being connected in parallel. The same reference numerals designate analogous circuit parts. The transistors MN21 and MN22 are connected in series and are protected against excessively high voltages by the transistor MN23. The transistors MP21 and MP22 are connected in parallel and are protected against excessively low voltage potentials at the node UP by the transistor MP23. Each switching transistor MP21 or MN21, respectively, and MP22 or MN22, respectively, is provided with its own protective circuit in the form of the transistors P1 or N1, respectively, and P2 or N2, respectively, at its gate.

A NOR gate (not specifically illustrated in the figures for reasons of simplicty) can be realized in an analogous manner by suitably connecting the P-type transistors in series and the N-type transistors in parallel.

Figure 3:
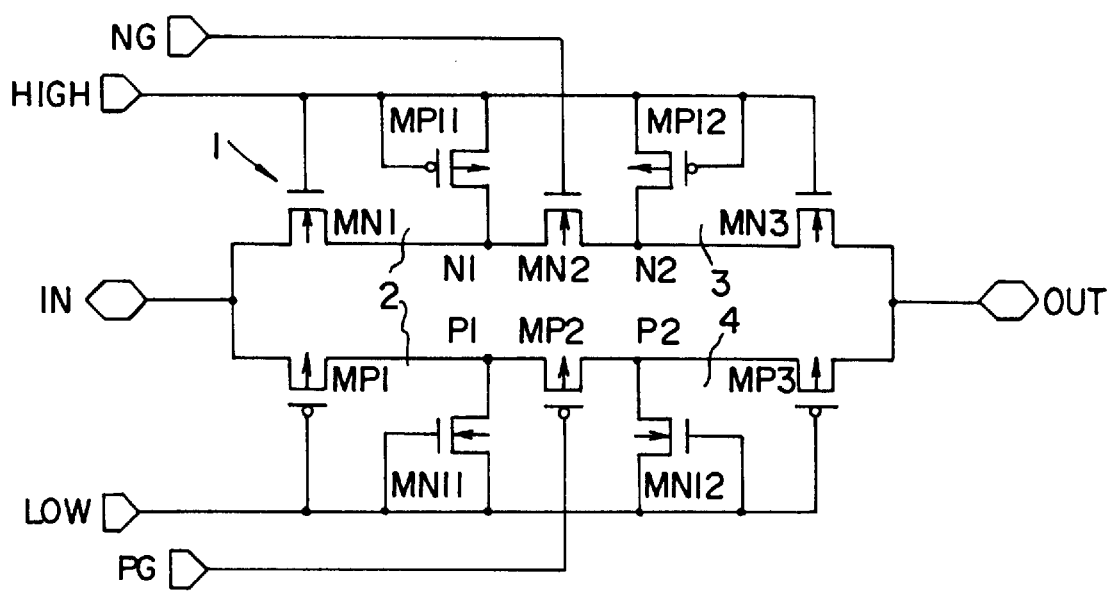
FIG. 3 is a circuit diagram of a logic gate formed as a transmission gate according to a third exemplary embodiment.

FIG. 3 illustrates a transmission gate or T-gate according to a third exemplary embodiment of the invention. Since a T-gate operates bidirectionally, a unique assignment of drain and source is not possible. For this reason, these transistor terminals and also the input and output, IN and OUT respectively, of the T-gate are designated as terminals. The T-gate shown in FIG. 3 can switch 5 V signals and is constructed using 3.3 V transistors. The transistors MN2 and MP2 constitute the switching transistors of the T-gate, and the nodes IN and OUT constitute the two terminals. To ensure that the T-gate turns off, the control terminal NG must be at 0 V and the control terminal PG must be at 5 V. In this case, the transistors MN1, MP11 and the transistors MN3, MP12 prevent the nodes N1 and N2 respectively (terminals of the switching transistor MN2) from rising above the potential HIGH, exactly as in the case of the inverter according to FIG. 1. The transistors MP1, MN11 and MP3, MN12 prevent the nodes P1 and P2 from falling below the potential LOW. What is thus achieved is that the voltage between the gate and the terminals of the switching transistors does not exceed the value of 3.6 V.

To ensure that the T-gate turns on, the node NG must be brought to high potential and the node PG to low potential. Low to medium potentials pass via the N-type paths of the transistors MN1, MN2 and MN3, and medium to high potentials pass via the P-type path of the transistors MP1, MP2 and MP3 from one terminal of the T-gate to the other. Accordingly, the node NG must not exceed the maximum permissible gate-source voltage (approximately 3.6 V). The node PG is permitted to be at most approximately 3.6 V below the value VDD=5 V (1.4 V). The situation becomes particularly critical with regard to the smallest possible on resistance in the case of medium potentials (2.5 V). In this case, both paths conduct, the gate-source voltage of the switching transistors being only 3.6 V–2.5 V and, respectively, 2.5 V–1.4 V=1.1 V. In order to obtain the smallest possible on resistance, it is important that the gate-source voltage become as large as possible. In other words, the potential value HIGH should be as high as possible and the potential value LOW should be as low as possible. On the other hand, however, the maximum permissible gate-source voltage must not be exceeded. In the case of a 3.3 V process, it is perfectly possible to choose 3.6 V, taking account of ±10% tolerance. That leads to the chosen voltages of 3.6 V for HIGH and 5 V–3.6 V=1.4 V for LOW.

In all the exemplary circuits illustrated (T-gate, inverter, NAND, NOR) the auxiliary voltages are passed only to the gates of MOS transistors. As a result, the requirements with regard to the power for the auxiliary voltages are very modest. In the steady state, these voltages are practically unloaded, so that they can be generated without a great outlay on the chip. Voltage dips due to dynamic loading can be absorbed by means of a suitably dimensioned capacitance with respect to the operating voltages.

Figure 4:
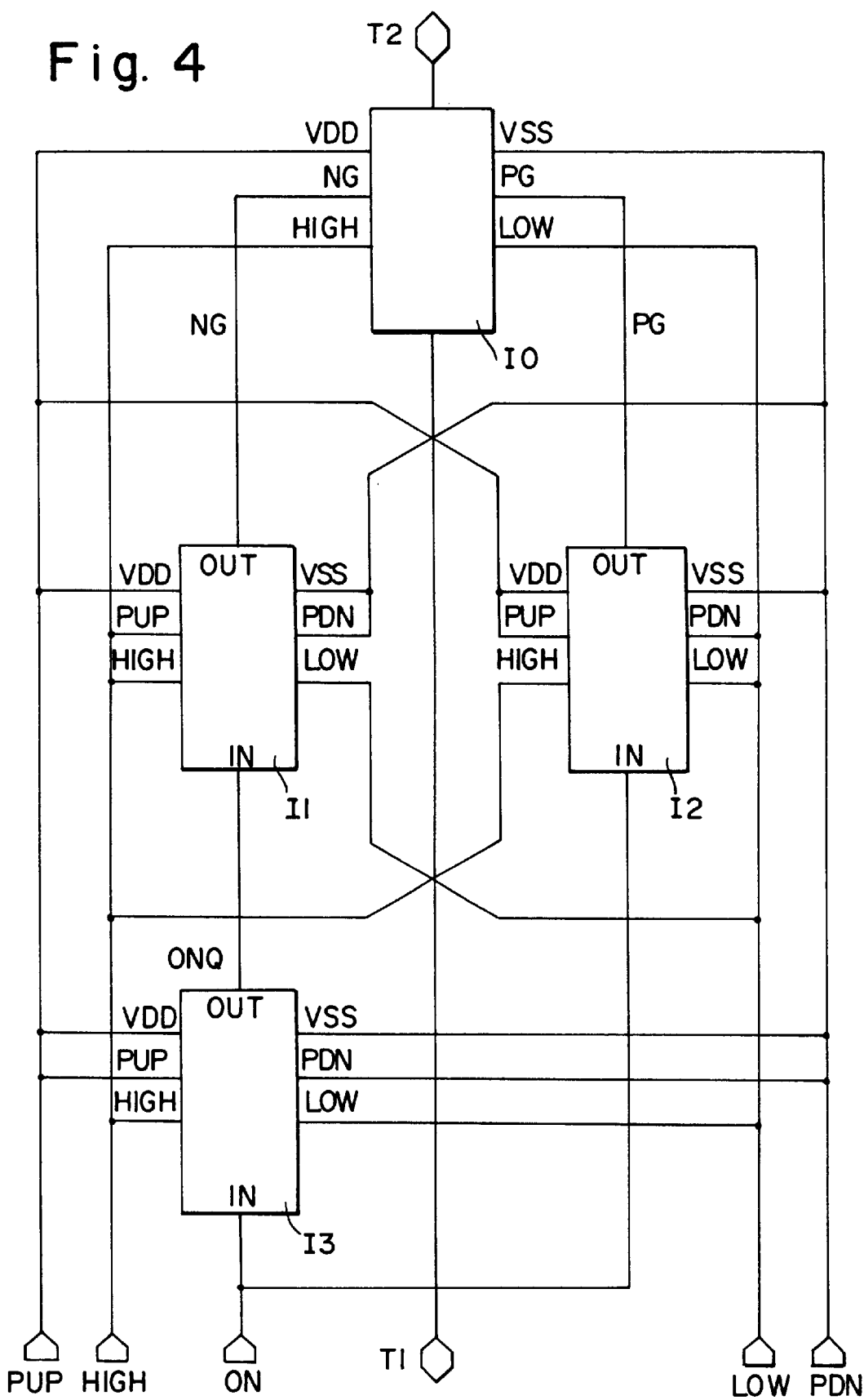
FIG. 4 is a circuit diagram of a control circuit having a transmission gate according to a fourth exemplary embodiment.

FIG. 4 illustrates the interconnection of a T-gate I0 according to FIG. 3 with three inverters I1, I2, I3 according to FIG. 1. The inverter I1 controls the node NG and is connected by its pull-up path PUP not to 5 V but only to 3.6 V. As a result, it supplies output voltages of 0 V (logic 0) and 3.6 V (logic 1), as are required for driving the node NG. By contrast, the inverter I2 supplies output voltages of 1.4 V (logic 0) and 5 V (logic 1) for driving the node PG. The inverter I3 accepts 5 V signals at its input and, at the output, supplies 5 V signals again and provides for the inverse driving of the inverters of I1 and I2. If 5 V are present at the control input ON, the T-gate turns on and a finite resistance forms between the two terminals T1 and T2. If ON is at 0 V, the T-gate turns off and a very high resistance forms between the two terminals T1 and T2.

Although in the overall circuit according to FIG. 4, the auxiliary voltages are also passed to the inverter terminals PUP and PDN, the inverters again drive only the gates of MOS transistors, so that in this circuit, too, no steady-state currents have to be supplied from the auxiliary voltages.

I claim:

1. A logic gate, comprising:
    an input terminal for receiving an input signal with two possible logic signal values;

an output terminal for outputting an output signal with two possible logic signal values assigned to two different logic voltage levels; and a logic circuit connected between said input terminal and said output terminal and supplied by a supply potential exceeding the logic voltage levels;

said logic circuit having a plurality of switching elements configured to operate according to the logic voltage levels, said logic circuit having an output path connected to said output terminal, said output path having at least two switching elements connected in series and acting as a voltage divider, and said output path being one of two output paths each having a protective diode device for discharging leakage currents from said switching elements.

2. The logic gate according to claim 1, wherein said switching elements are switching transistors.

3. The logic gate according to claim 1, wherein said output path is one of two reciprocally operating output paths with switching elements constructed and operating complementarily with respect to one another.

4. The logic gate according to claim 1, wherein said output path is one of two output paths constructed symmetrically with respect to one another and said output terminal forming a point of symmetry thereof.

5. The logic gate according to claim 1, wherein said output path is one of two output paths each having a further switching element connected in series with said at least two switching elements.

6. The logic gate according to claim 1, wherein said logic circuit is a circuit selected from the group consisting of a NOT gate, AND gate, NAND gate, OR gate, EXOR gate, NOR gate, and transmission gate.

7. A logic gate, comprising:

an input terminal for receiving an input signal with two possible logic signal values;

an output terminal for outputting an output signal with two possible logic signal values assigned to two different logic voltage levels, the two logic voltage levels being substantially 3.6 volts and substantially 1.4 volts; and a logic circuit connected between said input terminal and said output terminal and supplied by a supply potential exceeding the logic voltage levels, the supply potential being substantially 5 volts;

said logic circuit having a plurality of switching elements configured to operate according to the logic voltage levels, said logic circuit having an output path connected to said output terminal, said output path having at least two switching elements connected in series and acting as a voltage divider.

8. A logic gate, comprising:

an input terminal for receiving an input signal with two possible logic signal values;

an output terminal for outputting an output signal with two possible logic signal values assigned to two different logic voltage levels; and a logic circuit connected between said input terminal and said output terminal and supplied by a supply potential exceeding the logic voltage levels;

said logic circuit having a plurality of switching elements configured to operate according to the logic voltage levels, said logic circuit having an output path connected to said output terminal, said output path having at least two switching elements connected in series and acting as a voltage divider, said switching elements of said logic circuit being CMOS devices rated at 3.3 volts.

* * * * *